(12) United States Patent
Nadeau-Dostie et al.

(10) Patent No.: US 6,614,263 B2
(45) Date of Patent: Sep. 2, 2003

(54) METHOD AND CIRCUITRY FOR CONTROLLING CLOCKS OF EMBEDDED BLOCKS DURING LOGIC BIST TEST MODE

(75) Inventors: Benoit Nadeau-Dostie, Aylmer (CA); Jean-Francois Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/125,384

(22) Filed: Apr. 19, 2002

(65) Prior Publication Data

US 2003/0146777 A1 Aug. 7, 2003

Related U.S. Application Data

(60) Provisional application No. 60/353,951, filed on Feb. 5, 2002.

(51) Int. Cl.[7] .............................................. H03K 19/00
(52) U.S. Cl. .............................. 326/93; 326/38; 326/16
(58) Field of Search ....................... 326/37–41, 93–98, 326/16

(56) References Cited

U.S. PATENT DOCUMENTS

| | | | | |
|---|---|---|---|---|
| 4,800,564 A | * | 1/1989 | DeFazio et al. | ............. 714/814 |
| 5,336,950 A | * | 8/1994 | Popli et al. | ................... 326/39 |
| 5,651,013 A | * | 7/1997 | Iadanza | ....................... 714/731 |
| 5,850,150 A | * | 12/1998 | Mitra et al. | .................... 326/16 |

* cited by examiner

*Primary Examiner*—Don Le
(74) *Attorney, Agent, or Firm*—Eugene E. Proulx

(57) ABSTRACT

One aspect of the invention is generally defined as a method of designing an integrated circuit for distributing test clock signals to embedded cores having at least one core functional clock input, the method comprising, for each core, providing a clock gating circuit for selectively disabling a core functional clock signal applied to a core primary clock input; and providing a core clock selection circuit for each secondary core functional clock input for selecting one of a core functional clock signal output by the gating circuit and a core test clock signal and applying a selected signal to the each secondary core functional clock input.

54 Claims, 3 Drawing Sheets

METHOD AND CIRCUITRY FOR CONTROLLING CLOCKS OF EMBEDDED BLOCKS DURING LOGIC BIST TEST MODE

REFERENCE TO RELATED APPLICATIONS

This application claims the benefit of U.S. Provisional Application Serial No. 60/353,951 filed Feb. 5, 2002.

The present invention relates, in general, to the design and testing of integrated circuits and, more specifically, to a method of designing circuits having a hierarchical structure so as to provide improved test clock distribution circuitry and to integrated circuits produced by the method.

BACKGROUND OF THE INVENTION

As integrated circuits continue to become more complex and circuits are designed in a hierarchical fashion, it is becoming increasingly more difficult to distribute clock signals for both normal operational mode and in test mode in way that allows easy design and verification of tests for individual cores compatible with conventional design methods. One difficulty resides with the distribution of clock signals to selected cores during both testing of one or more selected cores and normal operation of the circuit. In some instances, it may be desired to test a core in isolation or independently of other cores. In other instances, it may be desired to test one or more selected cores while other cores are disabled or operated in functional mode. Still another difficulty is to provide a clock distribution method that is compatible with existing clock tree synthesis and layout methods, particularly in situations where clock trees span multiple cores. The clock distribution method must also provide a mechanism to control power consumption during test while also being flexible to accommodate different power consumption limits at different manufacturing stages. It is also important to preserve the level of synchronicity of the functional clock domains at all levels of test. In other words, the clock distribution method must keep clocks that span multiple cores synchronous to each other in top level tests in the same manner that this occurs in functional mode.

It will be seen that there is a for a test clock distribution method that allows at-speed testing of chip logic designed in an hierarchical fashion.

SUMMARY OF THE INVENTION

The present invention seeks to provide method of designing integrated circuits having embedded blocks or cores in a manner which will facilitate the distribution of clock signals to various clock domains and cores during both normal operation and testing of the cores and circuit.

One aspect of the invention is generally defined as a method of designing an integrated circuit for distributing test clock signals to embedded cores having at least one core functional clock input, the method comprising, for each core, providing a clock gating circuit for selectively disabling a core functional clock signal applied to a core primary clock input; and providing a core clock selection circuit for each secondary core functional clock input for selecting one of a core functional clock signal output by the gating circuit and a core test clock signal and applying a selected signal to the each secondary core functional clock input.

Another aspect of the invention relates to a novel circuit produced by the method of the present invention. This aspect of the invention is generally defined as a test clock distribution circuit for an integrated circuit having a plurality of embedded cores each having one or more functional clock inputs, comprising each core having a clock gating circuit for selectively disabling a core functional clock signal applied to a core primary clock input; and a clock selection circuit for each secondary core functional clock input for selecting between a core functional clock signal output by the gating circuit and a core test clock signal.

A still further aspect of the invention relates to a method of testing an integrated circuit having embedded cores and designed according to the method of the present invention. This aspect of the invention is generally comprises enabling core functional clock signals of selected cores by applying an inactive core clock disable signal to a clock gating circuit of the selected cores; selecting a test clock signal by applying an active core test enable signal to a clock selection circuit of the selected cores; disabling the core functional clock signals of non-selected embedded cores by applying an active core clock disable signal to respective clock gating circuits thereof in a manner that will preserve the state of memory elements in the other embedded cores and/or reduce the amount of power required to operate the integrated circuit while the selected core is being tested; applying a clock signal to the circuit functional clock inputs connected to the clock gating circuit of selected embedded cores; and activating embedded test controllers in the selected cores so as to test the selected cores.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

Figure 1:
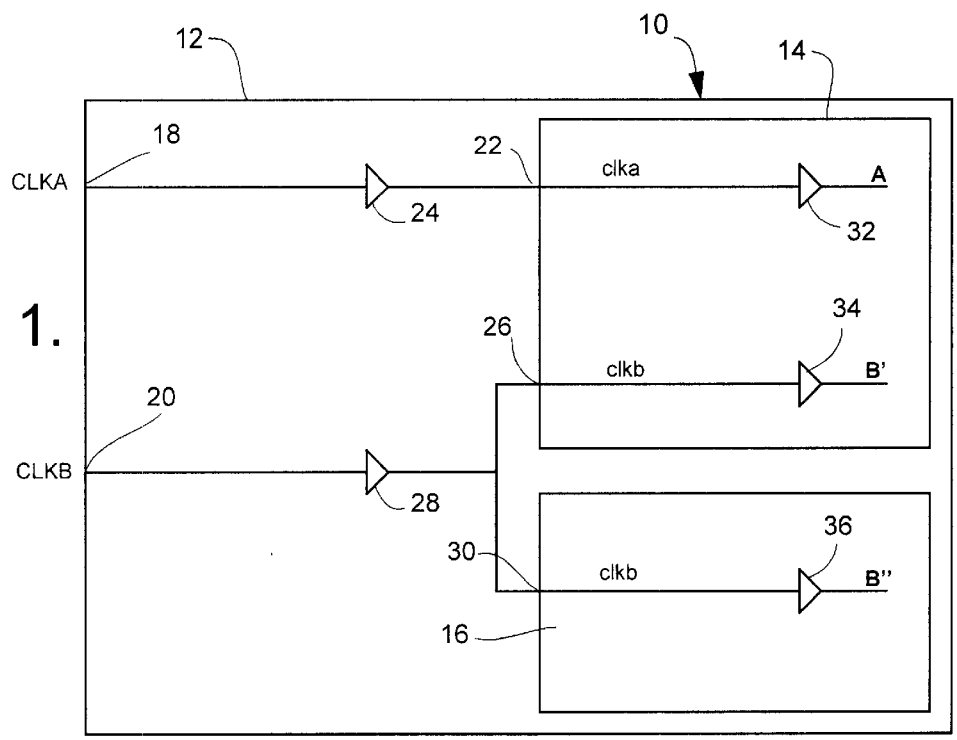
FIG. 1 is a diagrammatic view of the functional clock distribution in a circuit prior to modification according to the circuit design method of the present invention.

FIG. 1 illustrates a simple hierarchical circuit 10 which will be used to illustrate various aspects of the present invention. Circuit 10 comprises a top level block 12 and having two embedded cores 14 and 16. The circuit has two functional clock inputs 18 and 20. Clock input 18 receives a clock signal CLKA. Clock input 20 receives a clock signal CLKB. The CLKB clock domain spans cores 14 and 16, having a branch B' in core 14 and a branch B" in core 16.

Clock domain CLKA is completely contained within core 14. As indicated below, the clock trees or branches B' and B" are laid out separately as part the layout and are then balanced to each other in the top module.

Clock input 18 is connected to a first core clock functional input 22 of core 14 through a first clock distribution tree driven by clock buffer 24. Clock input 20 is connected to a second core clock functional input 26 of core 14 and to a core clock functional input 30 of core 16 through a second clock distribution tree driven by a clock buffer 28. Each core is also provided with clock distribution trees connected to their respective functional clock inputs. Thus, core 14 has a clock distribution tree 32 connected to clock input 22 and a clock distribution tree driven by clock buffer 34 connected to functional clock input 26. Core 16 has a clock distribution tree driven by clock buffer 36 connected to functional clock input 30. Other inputs and outputs of the circuit and cores have not been shown to simplify the description of the invention. As illustrated in FIG. 1, the circuit has not been designed for test.

Figure 2:
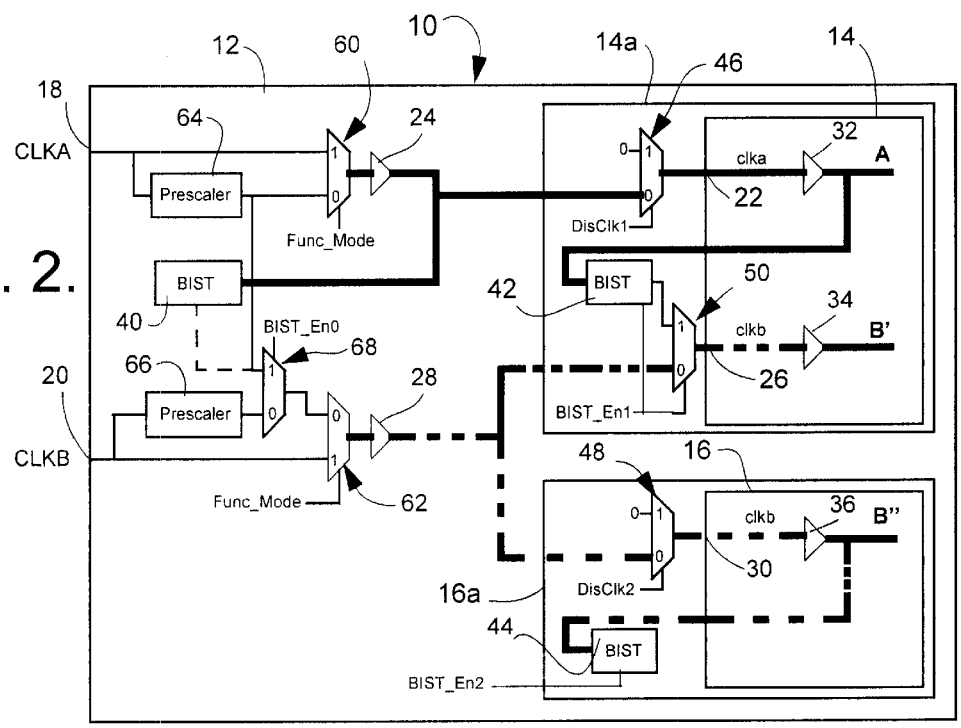
FIG. 2 is a diagrammatic view of the clock distribution in the circuit of FIG. 1 after modification according to an embodiment of the circuit design method of the present invention.
Figure 3:
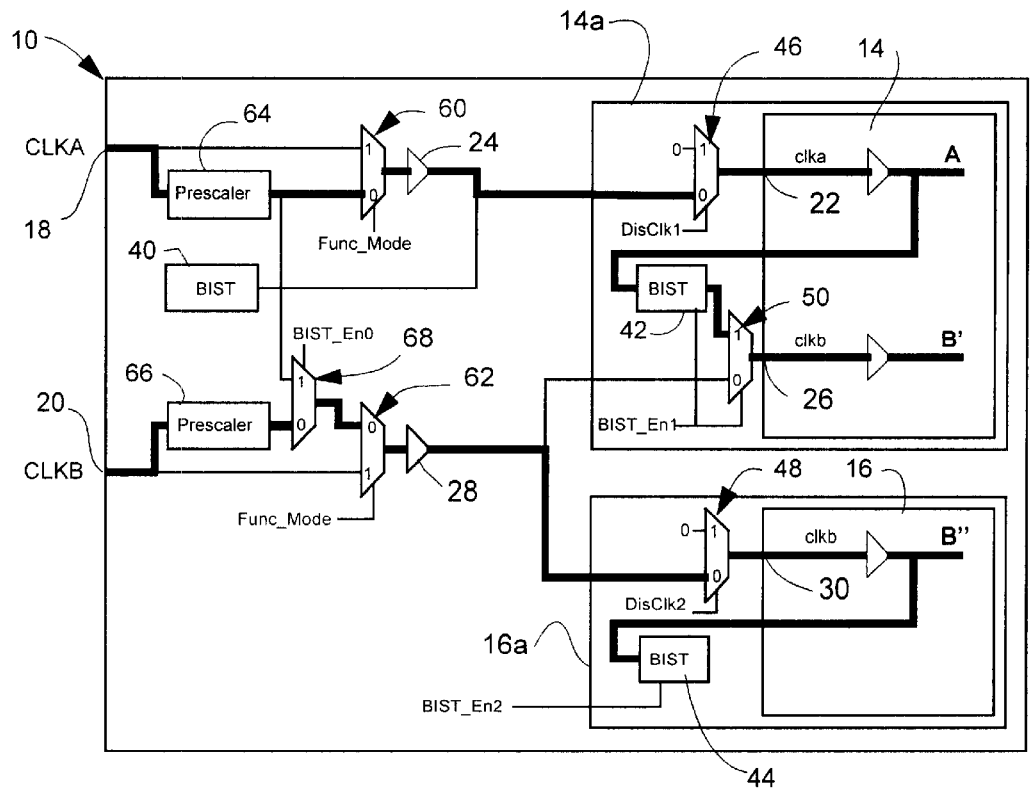
FIG. 3 is a view similar to that of FIG. 2, showing clock distribution paths during testing of the embedded cores.
Figure 4:
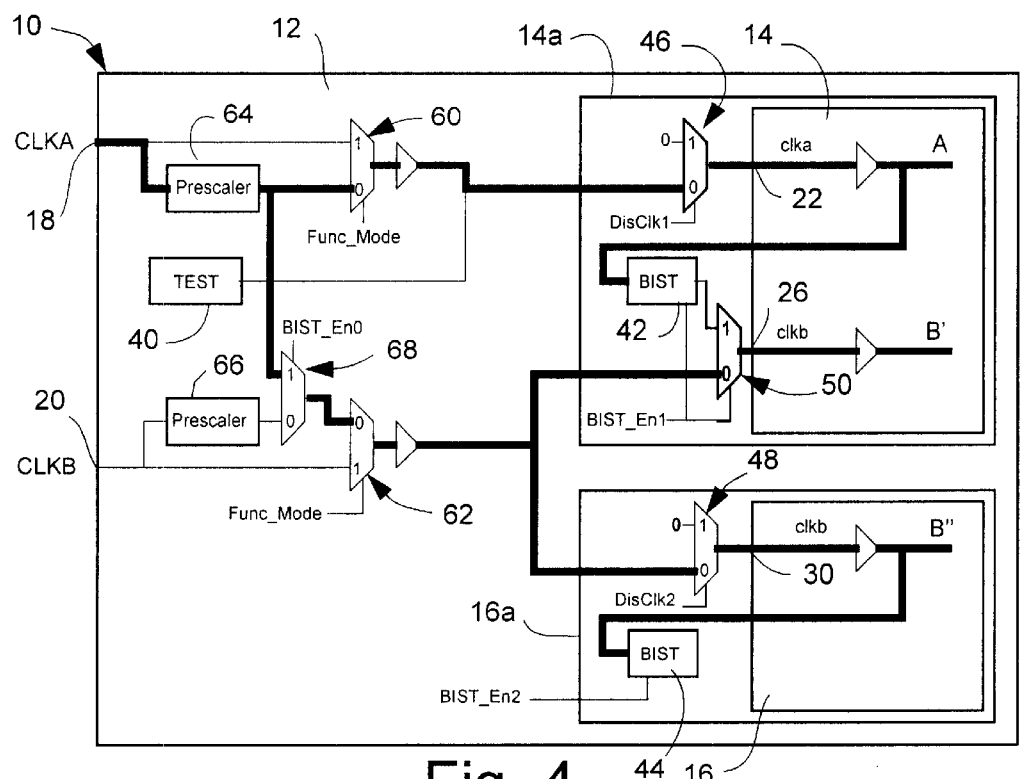
FIG. 4 is a view similar to FIG. 2, but showing the clock distribution path during testing of the parent block which contains the two embedded cores.
Figure 5:
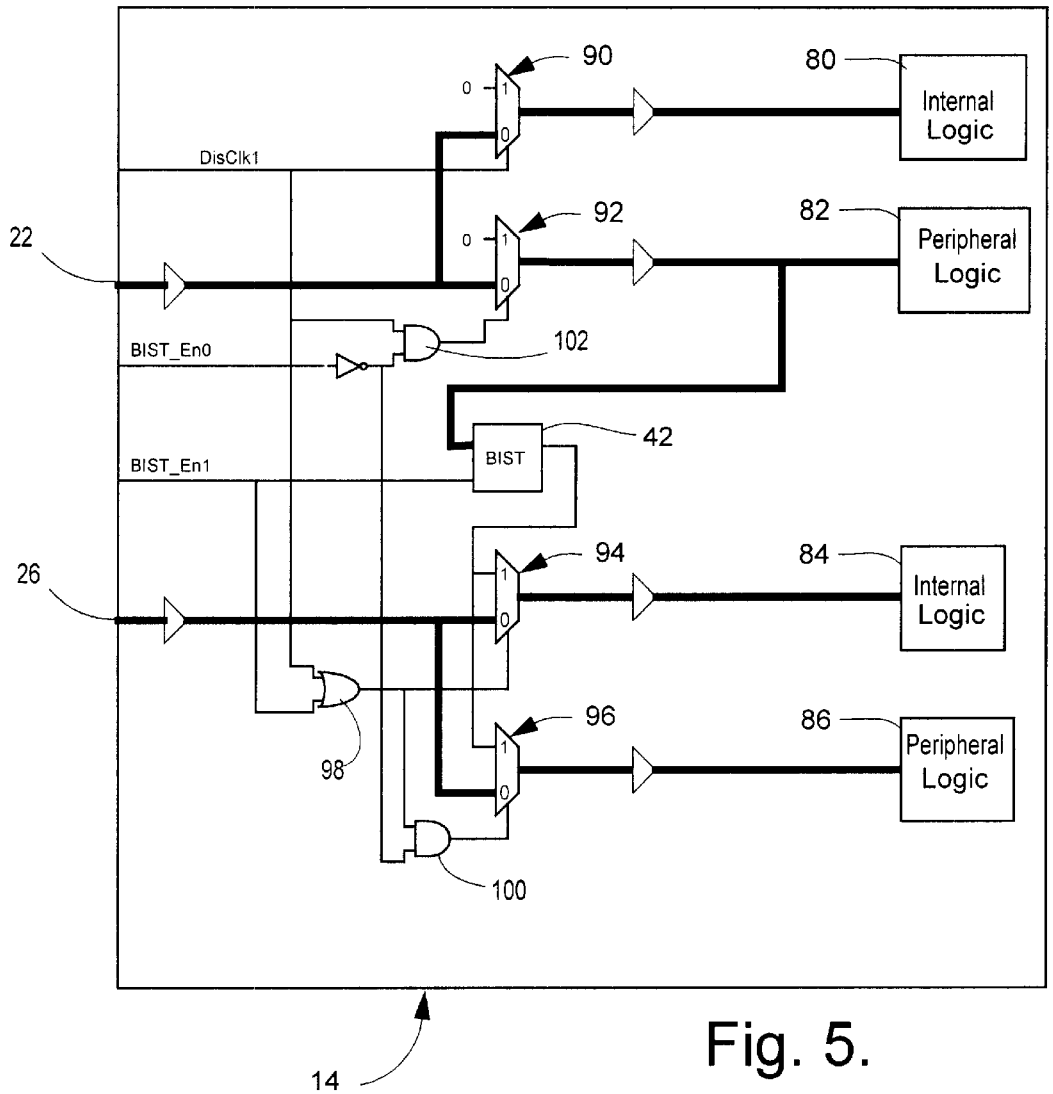
FIG. 5 is a more detailed diagrammatic view of a core having two functional clock inputs and clock distribution circuitry which allows clock branches connected to internal and peripheral logic to be disabled independently.

FIG. 2 illustrates the same circuit 10 after modification to incorporate embedded test structures and clock distribution circuitry according to an embodiment of the method of the present invention. A design tool inserts a first logic BIST (Built-In Self-Test) test controller 40 in top level block 12. Test controller 40 is used to test the top-level logic and interconnection between cores. The tool also inserts a second logic BIST test controller 42 into core 14 for use in testing core 14 and a third logic BIST test controller 44 into core 16 for use in testing core 16. In a core having more than one functional clock input, such as core 14, one clock input is designated as a primary or master clock input. The primary clock input is the input which is connected to the core test controller. Thus, in core 14, the primary clock input is functional clock input 22. The remaining clock inputs of the core are designated as secondary functional clock inputs. The cores are preferably designed to be configurable in internal and external test mode, such as is described in Applicant's prior U.S. patent application Ser. No. 09/626, 877 Filed Jul. 27, 2000 for "Hierarchical Design and Test Method and System, Program Product Embodying the Method and Integrated Circuit Produced Thereby", which application is incorporated herein by reference. The internal test mode is used to test core internal logic and the external test mode is used to test the parent block and peripheral logic surrounding the internal logic of the cores. The core specific test structures, such as the clock distribution selection and disabling (gating) circuitry and test controllers, may be inserted in collars 14a and 16a, as shown in FIGS. 2–4, or embedded into the cores, as shown in FIG. 5, described later.

In accordance with the present invention, each core is provided with a clock gating circuit for selectively disabling the core clock signal applied to the core primary clock input and a clock selection circuit is provided for each core secondary functional clock input for selecting between a core functional clock signal output by the gating circuit and a core test clock signal provided by the core test controller.

The clock gating circuit is controlled by a disable signal which provides a means by which the clock signal applied to the primary functional clock input may be selectively disabled, thereby disabling all clock activity within at least that portion of the core which is connected to the primary clock input. Accordingly, core 14 is provided with a clock gating circuit 46 and core 16 is provided with a clock gating circuit 48. In the illustrated embodiment, the gating circuit is in the form of a multiplexer. The 0 input of each multiplexer is connected to a functional clock source, as discussed later, and the 1 input of each multiplexer is not connected to a clock source. The control input of the multiplexer receives a disable signal, DisClk1 for gating circuit 46 and DisClk2 for gating circuit 48. It will be understood that any other equivalent gating circuit may be provided. It will be noted that the clock signal output by the clock gating circuit is connected to the input of a core clock buffer/distribution tree as well as to a clock input of the core test controller so that the clock signal used by the test controller is derived from a core functional clock. Core 16 does not have secondary functional clock inputs and, therefore, does not include any clock selection circuits. However, core 14 does have a secondary functional clock input, input 26, and, therefore, is provided with a clock selection circuit 50. Circuit 50 is in the form of a multiplexer which has its 1 input connected to a clock output of test controller 42, its 0 input connected to a functional clock source, discussed below, and a control input which receives a core test enable signal, BIST_En1. This signal is active when a test of the core is to be performed so that the clock output of the test controller is used during test operations. The signal is inactive during normal operation of the circuit.

In accordance with another feature of the present invention, top level block 12 is provided with a second clock selection circuit for each functional clock input to the circuit. The outputs of these selection circuits serve as core functional clock signal sources. Thus, it will be seen that a clock selection circuit 60 is associated with CLKA applied to clock input 18 and a clock selection circuit 62 is associated with CLKB applied to clock input 20. Preferably, the selection circuits are in the form of multiplexers, but any other equivalent circuit may used if desired. The second clock selection circuits are controlled to a mode signal, Func_Mode, for selecting between a functional clock signal source and a test clock signal source. During normal operation, the mode signal is active (logic 1). The 1 input of the selection circuit is connected to a functional clock input of the circuit. The 0 input of the selection circuit is connected to the output of a prescaler. A prescaler divides down the frequency of its input clock. Typical frequency ratios are 1 (i.e. no division), ½, ¼, ⅛, etc. Note that the functional clock source can go though a phase-lock loop (PLL) that might multiply the frequency. The input to each prescaler is connected to its corresponding clock input. Thus, a prescaler 64 is associated with CLKA and a prescaler 66 is associated with CLKB. The output of clock selection circuit 60 is applied to the clock distribution tree driven by clock buffer 24 in parent block 12. In addition, the output of the clock selection circuit associated with CLKA is connected to the clock input of parent block test controller 40 through the clock distribution tree.

The output of prescaler 66 is applied to the 0 input of a test clock selection circuit 68. The output of prescaler 64 is applied to the 1 input of test clock selection circuit 68. Alternatively, a clock output from the parent block test controller 40 may be connected to the 1 input of selection circuit 68. Test clock selection circuit 68 is controlled by a BIST enable signal, BIST_En0. When this signal is active, the clock signal derived from prescaler 64 (or test controller 40) is selected, otherwise the clock signal derived from prescaler 66 is selected. The output of test clock selection circuit 68 is applied to the 0 input of a clock selection circuit 62 associated with CLKB. The 1 input of the clock selection circuit associated with CLKB is connected to the functional clock input 20 for CLKB, as previously mentioned. The output of selection circuit 62 is connected to the input of the clock distribution tree driven by clock buffer 28 for CLKB, whose output, as already mentioned, is connected to the corresponding core functional clock inputs 26 and 30 in cores 14 and 16 through gating logic 50 and 48, respectively.

There is always only one level multiplexing at the base of each clock tree. A clock tree synthesis process performed by the aforementioned tool takes the multiplexers into consideration and balances the clock trees through the 0 input of the clock gating circuit within each core. The three logic test controllers used in the integrated circuit reside on a functional clock domain. The CLKA clock domain is used by the top level logic test controller as well as by the logic test controller in core 14. The bold lines on the CLKA (solid bold line) and CLKB (phantom bold lines) clock domains represent islands of synchronicity within each clock domain. Flip-flops on the B' branch of the CLKB clock domain can exchange data with setup and hold margin with flip-flops on the B" branch.

Preferably, a Test Access Port (TAP) (not shown) is provided to load the various signals mentioned above, such as the gating circuit disable signals, test controller enable signals. The clock signals applied to clock inputs 18 and 20 during test mode may be provided by a tester or may be generated by clock generators in the circuit.

At the top and at the core level, the clock domain on which the logic test controller resides is called the main clock domain or MCLK. The flip-flops in the clock domains form an island of synchronicity with the flip-flops within the associated logic test controller. The clock gating circuit 46 at the base of CLKA in core 14 allows for disabling all activities on the CLKA domain. The DisClk1 signal is controlled by the TAP by using a bit of its instruction register, a data register connected to the instruction register or by decoding instruction or data register bits, all of which are well known to those skilled in the art. This allows for a very flexible power management scheme in which the clocks can be completely stopped within some cores while other cores are being tested. Furthermore, with this arrangement, the state of all flip-flops within a core can be preserved while another core is being scanned out. This can also be applied to clock domains, such as CLKB, which spans more than one core. For example, the CLKA and B' branch of the CLKB domain can be frozen while the flip-flops on the B" branch of the CLKB domain are. kept active. Selection circuit 50 at the base of the B' branch of the CLKB domain in core 14 allows for controlling the domain from a test clock source derived from CLKA during logic BIST mode. In the example circuit, the test clock source of CLKB is the output port of the logic test controller 40, and may be a divided by 2 version of CLKA. Selection circuit 50 also allows disabling clock activity in CLKB when the DisClk1 signal is active. The CLKB domain in core 16 is the main clock domain in that core, and, accordingly, it also has a clock gating circuit 48 for clock disabling purposes.

Because the top level block or module typically contains only interconnection and a very limited amount of glue logic between the cores, a reduced test frequency can be used for all clocks in order to simplify the implementation of the top level logic BIST mode. The limited syntax supported by most current layout tools makes it difficult to describe the timing of both the functional and the test path for the layout of the top level block. Running at a reduced frequency in the top level logic BIST mode, described below, allows performing the layout of the top level module with only the functional timing constraints. In the example circuit the two cores are instantiated directly into the top level module. The two clock prescalers 64 and 66 are inserted into the top level block module for use by core test controllers 42 and 44 in cores 14 and 16, respectively, if the CLKA and CLKB frequencies are not a multiples of each other. Prescaler 64 is used by the top level test controller 40.

Method of Designing Circuit

In accordance with the method aspect of the present invention, the present invention provides a method of designing an integrated circuit in a manner which facilitates distribution of test clock signals to embedded cores having at least one core functional clock input, comprising, for each core, providing a clock gating circuit for selectively disabling a core functional clock signal applied to a core primary clock input; and providing a core clock selection circuit for each secondary core functional clock input for selecting one of a core functional clock signal output by the gating circuit and a core test clock signal and applying a selected signal to each secondary core functional clock input.

For each functional clock input in the circuit, the method provides a second clock selection circuit for providing a corresponding core functional clock signal source. The second clock selection circuit is responsive to a mode signal for selecting between a functional clock signal source and a test clock signal source.

The method further includes, for each core, designating one of the at least one functional clock input as a core primary clock input and all other core functional clock inputs as secondary core clock inputs, with the primary clock input being the clock input used to clock a core test controller.

The method provides a test clock selection circuit associated with each secondary circuit clock input for selecting a clock signal derived from a circuit master clock input or from an associated circuit secondary clock input and providing a test clock signal output to the second clock selection circuit associated with the circuit secondary clock input.

The step of providing a clock gating circuit includes inserting a description of the clock gating circuit into a circuit description of the integrated circuit and providing therefor a first input for connecting to a core functional clock signal source; a second input for receiving a core clock disable signal which is operable, when active, to disable the core functional clock signal; and an output connected to the core primary functional clock input. The second input of the core clock selection circuit is connected to a clock signal output of a core test controller.

The step of providing a core clock selection circuit includes inserting a description of the clock selection circuit into a circuit description of the integrated circuit, and providing therefor a first input connected to a secondary core functional clock signal source; a second input connected to a core test clock signal source; and a third input connected to a core test enable signal source for selecting, when inactive, the secondary core functional clock input and for selecting, when active, the core test clock signal source. The second input of the core clock selection circuit is connected to a clock signal output of a core test controller and a core test controller clock input is connected to the primary functional core clock input. The step of connecting the clock input of the core test controller includes connecting the primary functional clock input to an output of a clock distribution network.

The step of providing a second clock selection circuit includes inserting a description of the second clock selection circuit into a circuit description of the integrated circuit, and providing therefor a first input connected to a circuit functional clock signal source; a second input connected to a circuit test clock signal source; a third input connected to a circuit test enable signal source; and an output connected to a corresponding core functional clock signal source.

The method further includes connecting the clock gating circuit output to an input to a clock distribution network and connecting an output of the distribution network to corresponding core functional clock signal inputs.

The method further includes connecting the second input of the second clock selection circuit to an output of a prescaler which provides the circuit test clock signal source connecting a prescaler input to a circuit functional clock signal input for generating a test clock derived from a functional clock signal.

Still further, the method includes selecting a circuit master functional clock input from one of the circuit functional clock inputs, connecting the clock input of a circuit test controller to a circuit master functional clock input; and, for each additional circuit functional clock input, connecting the second input of the second clock selection circuit to the output of the circuit test controller when a circuit test enable signal is active.

For a core which is partitioned into internal and peripheral partitions, the step of providing a clock gating circuit comprises providing a clock gating circuit or each internal and peripheral partition connected to the core primary clock input or disabling the functional clock signal applied to the primary core functional clock input; the step of providing a core clock selection circuit comprises providing a clock selection circuit for each internal and peripheral partition connected to a core secondary clock input; and the peripheral partition clock gating circuits being operable to enable respective clock signals applied to associated functional clock inputs when a core parent block is under test.

Preferably, the method is automated by means of a program product having a variety of software tools stored on a computer readable storage medium for performing the above described steps.

Operation

Normal Operating Mode

When operating the circuit in normal operational mode, Func_Mode is active, DisClk1, DisClk2 are inactive (logic 0) and BIST_En0 and BIST_En1 are both inactive. As a result CLKA passes through input 1 of selection circuit 60, the clock distribution tree 24, to the 0 input of gating circuit 46 of core 14 and to the core functional clock input 22 of core 14. Similarly, CLKB passes through input 1 of selection circuit 63, clock distribution tree 28, to the 0 input of clock selection circuit 50 of core 14 and to the input of clock gating circuit 48 core 16.

Test Mode

The circuit may be tested in several ways. Each embedded core may be tested in isolation (individually or independently) of other cores, two or more cores may be tested simultaneously, the parent block may be tested simultaneously with its embedded blocks or with its embedded blocks configured in external test mode, as previously mentioned. The signal Func_Mode is set inactive when the circuit is tested.

In general, when testing a core (internal test), the clocks to the peripheral and internal logic of the core are active and aligned. When testing the top level block (external test), only clocks to the peripheral are active and possibly be aligned with other clocks in other cores or at the top-level, and the clocks to the internal logic are disabled to save power and/or preserve the state of the memory elements in the internal logic.

FIG. 3 shows clock distribution paths when the test controllers within cores 14 and 16 are active. When testing the cores in isolation, the cores use their own clock source and prescaler. When core 14 is being tested in isolation, Func_Mode, BIST_En0, and DisClk1 are set inactive, DisClk2 and BIST_En1 are set. active. This causes the output of prescaler 64 to be selected by CLKA selection circuit 60, which applies a clock signal to the 0 input of clock gating circuit 46 of core 14 which, in turn, applies its output to the input of its clock distribution tree 32 and to the clock input of test controller 42. Core clock selection circuit 50 selects the clock output of the test controller (because BIST_En1 is active) and applies it to the functional clock input of branch B' of clock domain CLKB. The B' branch of clock domain B is thus derived from CLKA. Test controller 42 then performs its test operations in the manner in which it was designed. All clock activities within core 16 are disabled because DisClk2 is set active prior to the start of the test.

When core 16 is being tested in isolation, Func_Mode and DisClk2 are set inactive, DisClk1 is set active and BIST_En0 is set inactive. BIST_En2 is active. The output of prescaler 66 to be selected by the CLKB selection circuit 62, which applies a clock signal to the 0 input or the clock gating circuit 48 of core 16 which, in turn, applies its output to the input of the core functional clock input 30 and then to clock distribution tree 36 and to the clock input of the core 16 test controller 44. Test controller 44 then performs its test operations in the manner in which it was designed. All clock activities within core 14 are disabled because DisClk1 is set active prior to the start of the test. Cores 14 and 16 are configured in internal test mode when tested in this manner.

When cores 14 and 16 are tested simultaneously, Func_Mode and DisClk1, DisClk2 and BIST_En0 are set inactive, and BIST_En1 and BIST_En2 are set active. Thus, the output of prescaler 64 is passed through to the clock input of test controller 42 of core 14, as previously explained, and applied to clock domain A and to the B' branch of clock domain B. The output of prescaler 66 is selected and applied to the input of test controller 44 of core 16 for testing the B" branch of clock domain B. Test controllers 42 and 44 then perform their respective test operations.

Top Level Test

FIG. 4 shows the clock distribution during a top level test operation. In this case, the clocks to all cores are all derived from CLKA and, thus, both branches B' and B" of clock domain B are operated in a synchronous relationship with respect to clock domain A. Func_Mode is set inactive and BIST_En0 are set active and DisClk1, DisClk2, BIST_En1 and BIST_En2 are set inactive. Core test controllers 44 and 46 are inactive. They could actually be included in the logic being tested by the top level controller.

As previously mentioned, it is preferred that the cores be designed to be configurable in internal and external test mode so that when testing the top level block, only the peripheral logic of the cores need testing and so that so that internal logic and peripheral logic can be tested independently. FIG. 5 diagrammatically illustrates a preferred embodiment for core 14. Core 16 would be designed in a similar fashion. The clock domain A circuitry is partitioned into internal partition 80 and peripheral partition 82. Similarly, the B' branch of domain B includes internal partition 84 and peripheral partition 86.

In this embodiment, a clock gating circuit is provided for each of the internal and the peripheral logic portions of the core circuitry. Thus, clock gating circuit 46 is replaced by gating circuits 90 and 92 and gating circuit 50 is replaced by gating circuits 94 and 96, respectively, for independently applying clock signals to the internal logic and peripheral logic of the various clock domains within the core. FIG. 5 shows the same islands of synchronicity as in FIG. 2. The two branches of the same clock connected to the internal and peripheral partitions remain aligned. Each of these gating circuits is in the form of a multiplexer, although, again, other circuitry may be provided without departing from the spirit of the invention. Disable signal DisClk1 is applied to the control input of gating circuit 90 and is gated to the control input of gating circuit 94 through OR gate 98. The output of OR gate 98 is also gated with the inverted version of BIST_En0 through AND gate 100 and applied to the control input of gating circuit 96. The other input to OR gate 98 is the BIST_En1 control signal. The DisClk1 and inverted BIST_En0 are gated through AND gate 102 and applied to the control input of gating circuit 92. Table I below shows the various combinations of signals which affect the clock signal in core 14. In general, when the clock disable signal is active, all clocks in the core are turned off, except when a top level test is to be performed. In this case, clock branches to internal logic are disabled and clock branches to peripheral logic is enabled.

TABLE I

| BIST_En0 | BIST_En1 | DisClk1 | Mode |
|---|---|---|---|
| 0 | 0 | 0 | Functional Clock Mode. All clocks are active. |
| 0 | 0 | 1 | All clocks disabled. Other cores may be tested. Clock output of test controller 42 is 0. |
| 0 | 1 | 0 | Internal core test mode. All core clocks are active. Other cores may have their clocks enabled or disabled. |
| 0 | 0 | 1 | Top-level test only. Clocks to peripheral partitions of core are active; clocks in internal partitions of cores are inactive. |

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of designing an integrated circuit for distributing test clock signals to embedded cores having at least one core functional clock input, the method comprising:
   for each core,
      providing a clock gating circuit for selectively disabling a core functional clock signal applied to a core primary clock input; and
      providing a core clock selection circuit for each secondary core functional clock input for selecting one of a core functional clock signal output by said gating circuit and a core test clock signal and applying a selected signal to said each secondary core functional clock input.

2. A method as defined in claim 1, further including, for each functional clock input in said circuit, providing a second clock selection circuit for providing a corresponding core functional clock signal source, said second clock selection circuit being responsive to a mode signal for selecting between a functional clock signal source and a test clock signal source.

3. A method as defined in claim 1, further including, for each core, designating one of said at least one functional clock input as a core primary clock input and all other core functional clock inputs as secondary core clock inputs, said primary clock input being a clock input used to clock a core test controller.

4. A method as defined in claim 2, further including providing a test clock selection circuit associated with each secondary circuit clock input for selecting a clock signal derived from a circuit master clock input or from an associated circuit secondary clock input and providing a test clock signal output to a second clock selection circuit associated with the circuit secondary clock input.

5. A method as defined in claim 3, said providing a clock gating circuit including: inserting a description of said clock gating circuit into a circuit description of said integrated circuit and providing therefor:
   a first input for connecting to a core functional clock signal source;
   a second input for receiving a core clock disable signal which is operable, when active, to disable the core functional clock signal; and
   an output connected to the core primary functional clock input.

6. A method as defined in claim 3, said providing a core clock selection circuit including inserting a description of said clock selection circuit into a circuit description of said integrated circuit, and providing therefor:
   a first input connected to a secondary core functional clock signal source;
   a second input connected to a core test clock signal source; and
   a third input connected to a core test enable signal source for selecting, when inactive, said secondary core functional clock input and for selecting, when active, said core test clock signal source.

7. A method as defined in claim 2, said providing a second clock selection circuit including inserting a description of said second clock selection circuit into a circuit description of said integrated circuit, and providing therefor:
   a first input connected to a circuit functional clock signal source;
   a second input connected to a circuit test clock signal source;
   a third input connected to a circuit test enable signal source; and
   an output connected to a corresponding core functional clock signal source.

8. A method as defined in claim 5, further including connecting said clock gating circuit output to an input to a core clock distribution network.

9. A method as defined in claim 5, further including:
   connecting said second input of said core clock selection circuit to a clock signal output of a core test controller; and
   connecting a core test controller clock input to said primary functional core clock input.

10. A method as defined in claim 9, said connecting a core test controller clock input including connecting the clock input to an output of a core clock distribution network.

11. A method as defined in claim 7, further including connecting the second input of said second clock selection circuit to an output of a prescaler which provides said circuit test clock signal source.

12. A method as defined in claim 11, further including connecting a prescaler input to a circuit functional clock signal input for generating a test clock derived from a functional clock signal.

13. A method as defined in claim 11, further including, for each core:
    selecting a circuit master functional clock input from one of said at least one core functional clock input;
    connecting the clock input of a circuit test controller to said circuit master functional clock input; and,
    for each additional circuit functional clock input:
        connecting the second input of said second clock selection circuit to the output of the circuit test controller when a circuit test enable signal is active.

14. A method as defined in claim 1 wherein, for a core which is partitioned into internal and peripheral partitions:
    said providing a clock gating circuit comprises providing a clock gating circuit for each internal and peripheral partition connected to said core primary clock input for disabling the functional clock signal applied to said primary core functional clock input;
    said providing a core clock selection circuit comprises providing a clock selection circuit for each internal and peripheral partition connected to a core secondary clock input;
    said peripheral partition clock gating and clock selection circuits being operable to enable respective clock signals applied to associated functional clock inputs when a core parent block is under test.

15. A method as defined in claim 14, said providing a clock gating circuit and a clock selection circuit further including providing circuit means responsive to a core clock gating circuit disable signal, a parent block test signal and a core test signal for generating clock gating circuit and clock selection circuit control signals.

16. A method of designing an integrated circuit for distributing test clock signals to embedded cores having at least one core functional clock input, the method comprising:
    for each core,
        designating one of said at least one functional clock input as a core primary clock input and all other core functional clock inputs as secondary core clock inputs, said primary clock input being a clock input used to clock a core test controller;
        providing a clock gating circuit for selectively disabling a core functional clock signal applied to a core primary clock input; and
        for each secondary core functional clock input in said core:
            providing a core clock selection circuit for selecting one of a core functional clock signal output by said gating circuit and a core test clock signal and applying a selected signal to said each secondary core functional clock input; and
    for each functional clock input in said circuit, providing a second clock selection circuit for providing a corresponding core functional clock signal source, said second clock selection circuit being responsive to a mode signal for selecting between a functional clock signal source during normal operation of said circuit and a test clock signal source during testing of said circuit; and
    providing a test clock selection circuit associated with each secondary circuit clock input for selecting a clock signal derived from a circuit master clock input or from an associated circuit secondary clock input and providing a test clock signal output to a second clock selection circuit associated with the circuit secondary clock input.

17. A method of testing selected embedded cores of a circuit designed according to the method of claim 6, comprising:
    enabling core functional clock signals of said selected cores by applying an inactive core clock disable signal to said clock gating circuit thereof;
    selecting a test clock signal by applying an active core test enable signal to said clock selection circuit of said selected cores;
    disabling the core functional clock signals of non-selected embedded cores by applying an active core clock disable signal to respective clock gating circuit thereof in a manner that will preserve the state of memory elements in said other embedded cores and/or reduce the amount of power required to operate said integrated circuit while said selected core is being tested;
    applying a clock signal to the circuit functional clock inputs connected to the clock gating circuit of selected embedded cores; and
    activating embedded test controllers in said selected cores so as to test said selected cores.

18. A method as defined in claim 17, further including operating one or more non-selected cores in normal operational mode while testing said selected cores.

19. A method as defined in claim 18, said operating non-selected cores in normal operational mode including:
    disabling embedded test controllers and enabling core functional clock signals of non-selected cores operated in functional mode; and
    applying functional clocks to all circuit functional clock inputs and applying an inactive control signal to second clock selection circuits to select the circuit functional clocks.

20. A method as defined in claim 17, said applying a clock signal including applying a clock signal having a clock frequency which is substantially the same as that used during a normal mode of operation of the circuit so as to perform an at-speed test of the circuit.

21. A method as defined in claim 20, wherein:
    the step of enabling is performed on two or more embedded cores having different functional circuit clock sources; and
    the step of applying clock signals comprising applying respective functional clock signals to circuit functional clock inputs connected to the first input of the clock gating circuit of the two or more embedded cores.

22. A method as defined in claim 21, wherein the step of applying comprising applying free-running clocks generated by an external tester or an on-chip clock generator.

23. A method as defined in claim 17, further including, for each core having circuitry connected to a core functional clock input and partitioned into internal and peripheral partitions, said enabling core functional clock signals including applying an inactive core clock disable signal to clock gating circuits of each said partitions.

24. A method of testing a hierarchical parent block containing embedded cores in a circuit designed according to the method defined in claim 4, comprising:
    for each said embedded cores,
        configuring the core in external test mode; and
        applying an inactive core clock disable signal to said clock gating circuit of the core and an inactive core test enable signal to each said clock selection circuit of the core;
    applying an active circuit test mode signal to a second clock selection circuit associated with a circuit master clock input to select a clock signal applied to said circuit master clock input;

applying an active parent block test enable signal to said test clock selection circuit so as to select a clock signal derived from said circuit master clock input; and applying an active circuit test mode signal to second clock selection circuits associated with circuit secondary clock inputs to select a clock signal output by said test clock selection circuit;

applying a clock signal to said circuit master functional clock input; and activating a test controller in said parent block to test said parent block.

25. A method as defined in claim 24, said applying a clock signal including applying a clock signal having a frequency which is less than that used during a normal mode operation of the circuit so as to reduce power consumption during testing.

26. A method as defined in claim 24, further including, for each core having circuitry connected to a core functional clock input and partitioned into internal and peripheral partitions, said enabling core functional clock signals including applying an active core clock disable signal to clock gating and clock selection circuits of each said internal partitions and an inactive clock disable signal of clock gating and clock selection circuits of each said peripheral partitions.

27. A method as defined in claim 26, said enabling core functional clock signals further including coupling said clock disable signal with said core test enable signal for selectively disabling a clock signal applied to an internal partitions connected to secondary core clock inputs in said core.

28. A test clock distribution circuit for hierarchical integrated circuits having a plurality of embedded cores each having one or more functional clock inputs, comprising:

each said core having:
a clock gating circuit for selectively disabling a core functional clock signal applied to a core primary clock input; and
a clock selection circuit for each secondary core functional clock input for selecting between a core functional clock signal output by said gating circuit and a core test clock signal.

29. A circuit as defined in claim 28, further including:
a second clock selection circuit for each functional clock input to said circuit for providing a corresponding core functional clock signal source, said second clock selection circuit being responsive to a test mode signal for selecting between a functional clock signal source and a test clock signal source.

30. A circuit as defined in claim 29, further including a prescaler associated with each functional clock input to said circuit, each prescaler having an input connected to its associated circuit functional clock input and an output connected to an associated second clock selection circuit.

31. A circuit as defined in claim 29, further including a phase lock loop connected between the input of said prescaler and the functional circuit clock input.

32. A circuit as defined in claim 29, further including a circuit test controller in said circuit for testing said circuit, said test controller having a clock input connected to the clock output of one of said second clock selection circuits.

33. A circuit as defined in claim 29, each said clock gating circuit having:
a first input for connecting to a core functional clock signal source;
a second input for receiving a core clock disable signal which is operable, when active, to disable the core functional clock signal; and
an output connected to the core primary functional clock input.

34. A circuit as defined in claim 29, each said core clock selection circuit having:
a first input connected to a secondary core functional clock input;
a second input connected to a core test clock signal source; and
a third input for receiving a core test enable signal for selecting, when inactive, the secondary core functional clock input and for selecting, when active, the core test clock signal source.

35. A circuit as defined in claim 34, each said core clock selection circuit having:
a first input connected to a secondary core functional clock input;
a second input connected to a core test clock signal source; and
a third input for receiving a core test enable signal for selecting, when inactive, the secondary core functional clock input and for selecting, when active, the core test clock signal source.

36. A circuit as defined in claim 28, each said embedded core further having a test controller having a clock input for receiving the clock signal output by said core clock gating circuit and a clock output providing a test clock signal.

37. A circuit as defined in claim 28, further including, for each core which is partitioned into internal and peripheral partitions:
said clock gating circuit comprises a clock gating circuit for each internal and peripheral partition connected to said core primary clock input for disabling the functional clock signal applied to said primary core functional clock input;
said core clock selection circuit comprises a clock selection circuit for each internal and peripheral partition connected to a core secondary clock input;
said peripheral partition clock gating and clock selection circuits being operable to enable respective clock signals applied to associated functional clock inputs when a core parent block is under test.

38. An integrated circuit having embedded cores with each core having at least one core functional clock input, comprising:

each said core having:
a core primary clock input corresponding to the core functional clock input used to clock a core test controller, and secondary core functional clock inputs corresponding to all others of said at least one core functional clock inputs;
a clock gating circuit for selectively disabling a core functional clock signal applied to said core primary clock input;
a core clock selection circuit for each secondary core functional clock input in said core for selecting one of the core functional clock signal output by said gating circuit and a core test clock signal output by said test controller for a selected signal to said secondary core functional clock input;

a second clock selection circuit for each functional clock input in said circuit for providing a core functional clock signal to corresponding core functional clock inputs, each said second clock selection circuit being responsive to a mode signal for selecting between a functional clock signal source during normal operation of said circuit and a test clock signal source during testing of said circuit; and a test clock selection circuit associated with each secondary circuit clock input for selecting a clock signal derived from a circuit master clock input or from an associated circuit secondary clock input and providing a test clock signal output to a second clock selection circuit associated the circuit secondary clock input.

39. A program product of designing an integrated circuit for distributing test clock signals to embedded cores having at least one core functional clock input, the program product comprising:

a computer readable storage medium;

means recorded on the medium for:

for each core, providing a clock gating circuit for selectively disabling a core functional clock signal applied to a core primary clock input; and providing a core clock selection circuit for each secondary core functional clock input for selecting one of a core functional clock signal output by said gating circuit and a core test clock signal and applying a selected signal to said each secondary core functional clock input.

40. A program product as defined in claim 39, said means further providing, for each functional clock input in said circuit, a second clock selection circuit for providing a corresponding core functional clock signal source, said second clock selection circuit being responsive to a mode signal for selecting between a functional clock signal source and a test clock signal source.

41. A program product as defined in claim 39, said means being further operable to, for each core, designate one of said at least one functional clock input as a core primary clock input and all other core functional clock inputs as secondary core clock inputs, said primary clock input being a clock input used to clock a core test controller.

42. A program product as defined in claim 40, said means further providing a test clock selection circuit associated with each secondary circuit clock input for selecting a clock signal derived from a circuit master clock input or from an associated circuit secondary clock input and providing a test clock signal output to a second clock selection circuit associated with the circuit secondary clock input.

43. A program product as defined in claim 41, said providing a clock gating circuit including:

inserting a description of said clock gating circuit into a circuit description of said integrated circuit and providing therefor:

a first input for connecting to a core functional clock signal source;

a second input for receiving a core clock disable signal which is operable, when active, to disable the core functional clock signal; and an output connected to the core primary functional clock input.

44. A program product as defined in claim 41, said providing a core clock selection circuit including inserting a description of said clock selection circuit into a circuit description of said integrated circuit, and providing therefor:

a first input connected to a secondary core functional clock signal source;

a second input connected to a core test clock signal source; and a third input connected to a core test enable signal source for selecting, when inactive, said secondary core functional clock input and for selecting, when active, said core test clock signal source.

45. A program product as defined in claim 40, said providing a second clock selection circuit including inserting a description of said second clock selection circuit into a circuit description of said integrated circuit, and providing therefor:

a first input connected to a circuit functional clock signal source;

a second input connected to a circuit test clock signal source;

a third input connected to a circuit test enable signal source; and an output connected to a corresponding core functional clock signal source.

46. A program product as defined in claim 43, said means being further operable to connect said clock gating circuit output to an input to a core clock distribution network.

47. A program product as defined in claim 43, said means being further operable to:

connect said second input of said core clock selection circuit to a clock signal output of a core test controller; and connect a core test controller clock input to said primary functional core clock input.

48. A program product as defined in claim 47, said connect a core test controller clock input including connecting the clock input to an output of a clock distribution network.

49. A program product as defined in claim 45, said means being further operable to connect the second input of said second clock selection circuit to an output of a prescaler which provides said circuit test clock signal source.

50. A program product as defined in claim 49, said means being operable to connect a prescaler input to a circuit functional clock signal input for generating a test clock derived from a functional clock signal.

51. A program product as defined in claim 49, said means being further operable to, for each core:

select a circuit master functional clock input from one of said at least one core functional clock input;

connect the clock input of a circuit test controller to a circuit master functional clock input; and, for each additional circuit functional clock input:

connect the second input of said second clock selection circuit to the output of the circuit test controller when a circuit test enable signal is active.

52. A program product as defined in claim 39 wherein, for a core which is partitioned into internal and peripheral partitions:

said providing a clock gating circuit comprises providing a clock gating circuit for each internal and peripheral partition connected to said core primary clock input for disabling the functional clock signal applied to said primary core functional clock input;

said providing a core clock selection circuit comprises providing a clock selection circuit for each internal and peripheral partition connected to a core secondary clock input;

said peripheral partition clock gating and clock selection circuits being operable to enable respective clock signals applied to associated functional clock inputs when a core parent block is under test.

53. A program product as defined in claim 52, said providing a clock gating circuit and a clock selection circuit further including providing circuit means responsive to a core clock gating circuit disable signal, a parent block test signal and a core test signal for generating clock gating circuit and clock selection circuit control signals.

54. A program product of designing an integrated circuit for distributing test clock signals to embedded cores having at least one core functional clock input, the program product comprising:

a computer readable storage medium;

means recorded on the medium for:

for each core, designating one of said at least one functional clock input as a core primary clock input and all other core functional clock inputs as secondary core clock inputs, said primary clock input being a clock input used to clock a core test controller;

providing a clock gating circuit for selectively disabling a core functional clock signal applied to a core primary clock input; and for each secondary core functional clock input in said core:

providing a core clock selection circuit for selecting one of a core functional clock signal output by said gating circuit and a core test clock signal and applying a selected signal to said each secondary core functional clock input; and for each functional clock input in said circuit, providing a second clock selection circuit for providing a corresponding core functional clock signal source, said second clock selection circuit being responsive to a mode signal for selecting between a functional clock signal source during normal operation of said circuit and a test clock signal source during testing of said circuit; and providing a test clock selection circuit associated with each secondary circuit clock input for selecting a clock signal derived from a circuit master clock input or from an associated circuit secondary clock input and providing a test clock signal output to a second clock selection circuit associated with the circuit secondary clock input.

* * * * *